US012610649B2

(12) United States Patent
Chen et al.

(10) Patent No.: US 12,610,649 B2
(45) Date of Patent: Apr. 21, 2026

(54) SOLAR CELL AND MANUFACTURING METHOD THEREOF, PROCESSING METHOD OF N-TYPE DOPED SILICON FILM AND SEMICONDUCTOR DEVICE

(71) Applicant: JA SOLAR TECHNOLOGY YANGZHOU CO., LTD., Yangzhou (CN)

(72) Inventors: Xiaoye Chen, Yangzhou (CN); Junbing Zhang, Yangzhou (CN); Wei Shan, Yangzhou (CN)

(73) Assignee: JA SOLAR TECHNOLOGY YANGZHOU CO., LTD., Yangzhou (CN)

( * ) Notice: Subject to any disclaimer, the term of this patent is extended or adjusted under 35 U.S.C. 154(b) by 1164 days.

(21) Appl. No.: 17/618,821

(22) PCT Filed: Jul. 27, 2020

(86) PCT No.: PCT/CN2020/104771
§ 371 (c)(1),
(2) Date: Dec. 13, 2021

(87) PCT Pub. No.: WO2021/128831
PCT Pub. Date: Jul. 1, 2021

(65) Prior Publication Data
US 2022/0238748 A1 Jul. 28, 2022

(30) Foreign Application Priority Data
Dec. 27, 2019 (CN) .......................... 201911380721.9

(51) Int. Cl.
*H10F 71/00* (2025.01)
*H10F 77/30* (2025.01)

(52) U.S. Cl.
CPC ......... *H10F 71/129* (2025.01); *H10F 71/121* (2025.01); *H10F 71/128* (2025.01); *H10F 77/311* (2025.01)

(58) Field of Classification Search
CPC ............... H01L 31/1864; H01L 31/186; H01L 31/1872; H01L 31/0747; H01L 31/0745;
(Continued)

(56) References Cited

U.S. PATENT DOCUMENTS 5,773,340 A * 6/1998 Kumauchi ........... H10D 84/038
438/584
6,040,236 A * 3/2000 Aiso ................. H01L 21/28035
438/565
(Continued)

FOREIGN PATENT DOCUMENTS

CN 108701736 A 10/2018
CN 109148647 A 1/2019
(Continued)

OTHER PUBLICATIONS

Chang Han-Chen et al: "Poly-Si Passivated Solar Cells Fabricated by Firing Contact metallization with the Shallow Silver Penetration", Proc. of the 36th European Photovoltaic Solar Energy Conference, Sep. 9, 2019.
(Continued)

*Primary Examiner* — Earl N Taylor
(74) *Attorney, Agent, or Firm* — Volpe Koenig

(57) ABSTRACT

Embodiments of the present disclosure provide a solar cell and a manufacturing method thereof, a processing method of an n-type doped silicon film, and a semiconductor device. The manufacturing method of the solar cell includes: providing a silicon wafer; forming an n-type doped silicon film on a first main surface of the silicon wafer at a first temperature, and simultaneously forming the n-type doped
(Continued)

silicon film on at least a portion of surfaces of the silicon wafer except the first main surface due to wrapping around; performing a heat treatment on the n-type doped silicon film at a second temperature; etching and removing the n-type doped silicon film on the surfaces of the silicon wafer except the first main surface after performing the heat treatment; and preparing the solar cell by using the silicon wafer, the first temperature is lower than the second temperature.

14 Claims, 5 Drawing Sheets

(58) Field of Classification Search
CPC ............. H01L 31/0682; H01L 31/0288; H01L 31/02167; H01L 29/786; H01L 31/068; H10F 71/129; H10F 71/128; H10F 77/311; H10F 10/165; H10F 10/166; H10F 71/131; H10F 10/146; H10F 71/00; H10F 77/1223; H10F 71/121; H10D 30/6739; H10D 64/662
See application file for complete search history.

(56) References Cited

U.S. PATENT DOCUMENTS 7,670,966 B2 * 3/2010 Dubois ............... H10F 71/1215
438/58

| | | | |
|---|---|---|---|
| 2009/0253225 A1 * | 10/2009 | Dubois | ............... H01L 21/3242 |
| | | | 257/E31.127 |
| 2022/0238748 A1 * | 7/2022 | Chen | ..................... H10F 10/166 |

FOREIGN PATENT DOCUMENTS

| CN | 109216498 A | 1/2019 |
|---|---|---|
| CN | 109216499 A | 1/2019 |
| CN | 110197855 A | 9/2019 |
| CN | 209515717 U | 10/2019 |
| CN | 111354838 A | 6/2020 |
| CN | 110571309 B | 3/2021 |

OTHER PUBLICATIONS

Martel B et al: "Towards the Mass Production of High Efficiency Passivated Contacts n-Type PERT Solar Cells", Proc . of the 35th European Photovoltaic Solar Energy Conference, Sep. 24, 2018.
Duttagupta Shubhamet Al: "monoPolyTM cells: Large-area crystalline silicon solar cells with fire-through screen printed contact to doped polysilicon surfaces", Solar Energy Materials and Solar Cells, Elsevier Science Publishers, Amsterdam, NL, vol. 187, Aug. 1, 2018.
Sheng Jian et al: "Impact of phosphorus diffusion on n-type poly-Si based passivated contact silicon solar cells", Solar Energy Materials and Solar Cells, Elsevier Science Publishers, Amsterdam, NL, vol. 203, Sep. 24, 2019.
Extended European Search Report, European Patent Application No. 20907093.7, issued Jul. 7, 2022.

* cited by examiner

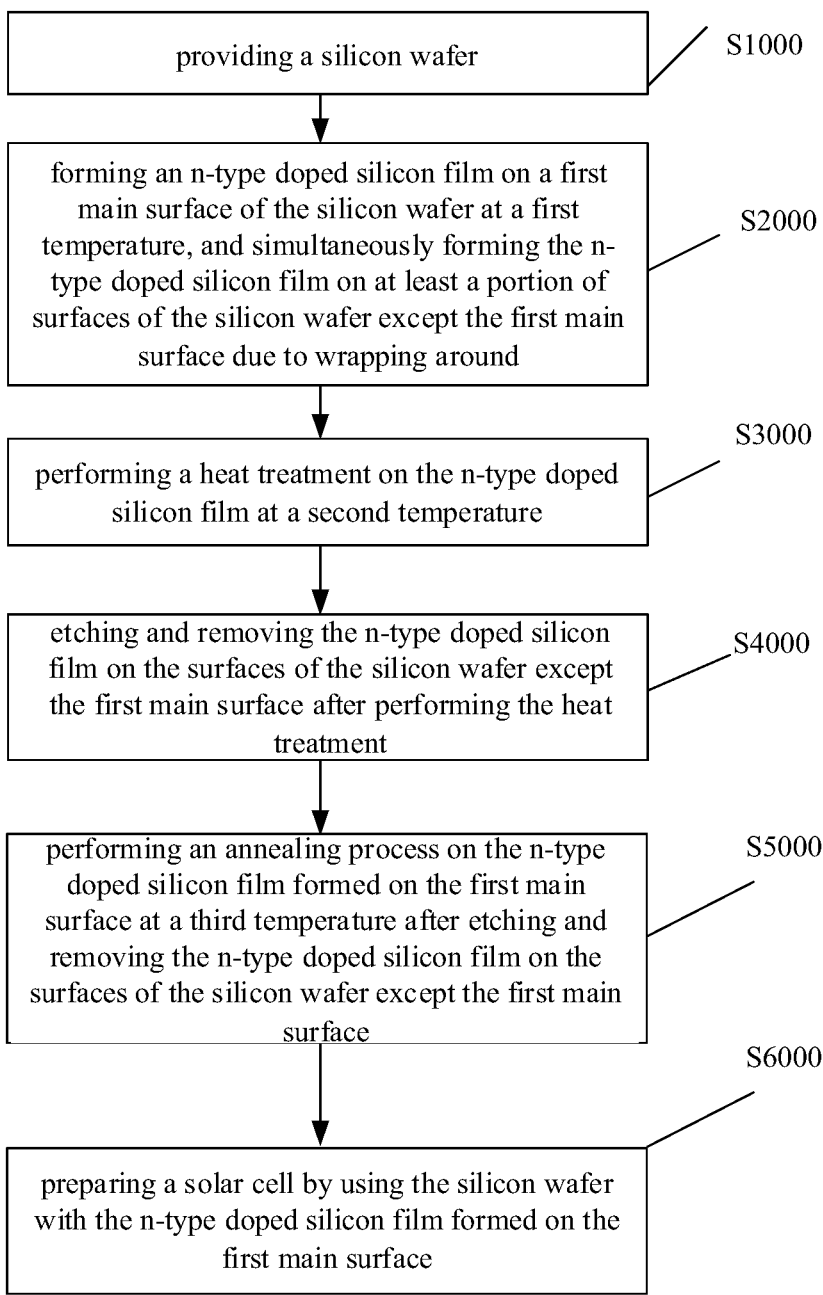

providing a silicon wafer — S1000 forming an n-type doped silicon film on a first main surface of the silicon wafer at a first temperature, and simultaneously forming the n-type doped silicon film on at least a portion of surfaces of the silicon wafer except the first main surface due to wrapping around — S2000 performing a heat treatment on the n-type doped silicon film at a second temperature — S3000 etching and removing the n-type doped silicon film on the surfaces of the silicon wafer except the first main surface after performing the heat treatment — S4000 performing an annealing process on the n-type doped silicon film formed on the first main surface at a third temperature after etching and removing the n-type doped silicon film on the surfaces of the silicon wafer except the first main surface — S5000

S6000 preparing a solar cell by using the silicon wafer with the n-type doped silicon film formed on the first main surface

Fig. 5

SOLAR CELL AND MANUFACTURING METHOD THEREOF, PROCESSING METHOD OF N-TYPE DOPED SILICON FILM AND SEMICONDUCTOR DEVICE

TECHNICAL FIELD

Embodiments of the present disclosure relate to a solar cell and a manufacturing method thereof, a processing method of an n-type doped silicon film, and a semiconductor device.

BACKGROUND

N-type doped silicon films, such as phosphorus-doped silicon films, can be used to manufacture electronic components, the n-type doped silicon films can be used to manufacture a gate electrode of a thin film transistor and passivate a surface of a crystalline silicon solar cell. With regard to the field of solar cells, n-type doped silicon films have excellent passivation effect on the surface of n-type silicon wafer, and the value of the Implied Voc (implied open circuit voltage) of silicon wafer passivated by symmetrical n-type doped silicon film on both sides can reach above 745 mV.

Tunneling oxygen passivated contact (TOPCon) solar cell is a new type of silicon solar cell proposed by Fraunhofer Institute in Germany in 2013. The back surface of the cell is covered with an ultra-thin silicon oxide layer, then covered with a doped polysilicon or amorphous silicon layer, and then annealed at high temperature to form a highly doped polysilicon (n+) back contact. The back structure of the cell sequentially includes an n-type silicon wafer, an ultrathin tunneling oxide layer, an n+ polysilicon layer, a passivation layer, and a metal electrode layer.

SUMMARY

At an aspect, embodiments of the present disclosure provide a manufacturing method of a solar cell, which includes: providing a silicon wafer; forming an n-type doped silicon film on a first main surface of the silicon wafer at a first temperature, and simultaneously forming the n-type doped silicon film on at least a portion of surfaces of the silicon wafer except the first main surface due to wrapping around; performing a heat treatment on the n-type doped silicon film at a second temperature; etching and removing the n-type doped silicon film on the surfaces of the silicon wafer except the first main surface after performing the heat treatment; and preparing a solar cell by using the silicon wafer with the n-type doped silicon film formed on the first main surface of the silicon wafer, and the first temperature is lower than the second temperature.

For example, after etching and removing the n-type doped silicon film on the surfaces except the first main surface, the manufacturing method further comprises: annealing the n-type doped silicon film formed on the first main surface at a third temperature, the third temperature is higher than the first temperature.

For example, performing the heat treatment on the n-type doped silicon film at the second temperature comprises: performing the heat treatment on the n-type doped silicon film for 5-200 minutes within a temperature range of 580-1000° C., to reduce content of inactive doping atoms in the n-type doped silicon film.

For example, performing the heat treatment of the n-type doped silicon film at the second temperature comprises:

performing the heat treatment on the n-type doped silicon film within a temperature range of 590-750° C. for 10-60 minutes, to reduce the content of the inactive doping atoms in the n-type doped silicon film.

For example, before forming the n-type doped silicon film on the first main surface of the silicon wafer at the first temperature, the manufacturing method further comprises: forming a barrier layer on the surfaces of the silicon wafer except the first main surface.

For example, the barrier layer comprises a silicon oxide layer, a boron-doped silicon oxide layer, a silicon nitride layer or a combination of materials selected from a group consisting of a silicon oxide layer, a boron-doped silicon oxide layer and the silicon nitride layer, and a thickness range of the barrier layer is 30-500 nm.

For example, forming the n-type doped silicon film on the first main surface of the silicon wafer at the first temperature, and simultaneously forming the n-type doped silicon film on at least a portion of surfaces of the silicon wafer except the first main surface due to wrapping around comprises: in-situ depositing the n-type doped silicon film on the first main surface of the silicon wafer at the first temperature, and simultaneously in-situ depositing the n-type doped silicon film on at least a portion of surfaces of the silicon wafer except the first main surface due to wrapping around, the n-type doped silicon film is an in-situ n-type doped silicon film.

For example, in-situ depositing the n-type doped silicon film on the first main surface of the silicon wafer at the first temperature, and simultaneously in-situ depositing the n-type doped silicon film on at least a portion of surfaces of the silicon wafer except the first main surface due to wrapping around, the n-type doped silicon film is an in-situ n-type doped silicon film comprises: in-situ depositing the in-situ n-type doped silicon film with a thickness of 2 nm-2000 nm at a temperature lower than 580° C., by using a silicon-containing gas and a gas containing an n-type doping element as reaction precursors.

For example, the n-type doped silicon film is a phosphorus-doped silicon film, the silicon-containing gas is silane, and the gas containing n-type doping element is phosphine.

For example, during forming the n-type doped silicon film on the first main surface of the silicon wafer at the first temperature, and simultaneously forming the n-type doped silicon film on at least a portion of surfaces of the silicon wafer except the first main surface due to wrapping around, the n-type doped silicon film is a single-layer n-type doped silicon film or a stacked layer formed by an n-type doped silicon film sub-layer and an un-doped silicon film sub-layer which are alternately arranged, and the silicon film includes an amorphous silicon film, a polysilicon film, or a mixed film of the amorphous silicon film and the polysilicon film.

For example, when or after performing the heat treatment on the n-type doped silicon film at the second temperature, and before etching and removing the n-type doped silicon film on the surfaces of the silicon wafer except the first main surface, the manufacturing method further comprises: forming a silicon oxide layer on the n-type doped silicon film; and before etching and removing the n-type doped silicon film on the surfaces of the silicon wafer except the first main surface and after forming the silicon oxide layer on the n-type doped silicon film, the manufacturing method further comprises: removing the silicon oxide layer on the surfaces of the silicon wafer except the first main surface, and retaining the silicon oxide layer on the first main surface.

For example, removing the silicon oxide layer on the surfaces of the silicon wafer except the first main surface comprises: removing the silicon oxide layer on the surfaces of the silicon wafer except the first main surface by using a hydrofluoric acid solution and at a same time retaining the silicon oxide layer on the first main surface of the silicon wafer.

For example, etching and removing the n-type doped silicon film on the surfaces of the silicon wafer except the first main surface comprises: etching and removing a portion of the n-type doped silicon film on the surfaces of the silicon wafer except the first main surface by using an alkali solution.

For example, a mass percentage of the alkali solution is 0.5%-20%, and an etching time is 1-10 minutes.

For example, the alkali solution is a potassium hydroxide solution, a sodium hydroxide solution, a tetramethyl ammonium hydroxide solution, or an ammonium hydroxide solution with a mass percentage of 5%, and the etching time is 3 minutes.

For example, the silicon wafer is an n-type semiconductor silicon wafer, the first main surface is a back surface of the n-type semiconductor silicon wafer, and the surfaces of the silicon wafer except the first main surface include a front surface of the silicon wafer and a side surface of the silicon wafer.

For example, after etching and removing the n-type doped silicon film on the surfaces of the silicon wafer except the first main surface and before preparing the solar cell by using the silicon wafer with the n-type doped silicon film formed on the first main surface, the manufacturing method of the solar cell further comprises: removing the silicon oxide layer on the n-type doped silicon film of the silicon wafer by using an acid solution; and before forming the n-type doped silicon film on the first main surface of the silicon wafer, the manufacturing method further comprises: forming a passivation tunneling layer on the first main surface of the silicon wafer.

At another aspect, embodiments of the present disclosure provide a processing method of an n-type doped silicon film, which includes: forming the n-type doped silicon film on a substrate at a first temperature; performing a heat treatment on the n-type doped silicon film at a second temperature; and etching and removing a portion of the n-type doped silicon film after the heat treatment, and the first temperature is lower than the second temperature.

For example, the performing the heat treatment on the n-type doped silicon film at the second temperature comprises: performing the heat treatment on the n-type doped silicon film within a temperature range of 580-1000° C. for 5-200 minutes, to reduce content of inactive doping atoms in the n-type doped silicon film.

For example, the performing the heat treatment on the n-type doped silicon film at the second temperature comprises: performing the heat treatment on the n-type doped silicon film within a temperature range of 590-750° C. for 10-60 minutes, to reduce the content of the inactive doping atoms in the n-type doped silicon film.

For example, the forming the n-type doped silicon film on the substrate at the first temperature comprises: in-situ depositing the n-type doped silicon film on the substrate at the first temperature, wherein the n-type doped silicon film is an in-situ n-type doped silicon film.

For example, the in-situ depositing the n-type doped silicon film on the substrate at the first temperature comprises: in-situ depositing the n-type doped silicon film with a thickness of 2-2000 nm at a temperature lower than 580°

C. on the substrate, by using a silicon-containing gas and a gas containing an n-type doping element as reaction precursors.

For example, the silicon-containing gas is silane and the gas containing the n-type doping element is phosphine, and the in-situ depositing the n-type doped silicon film with a thickness of 2-2000 nm at a temperature lower than 580° C. on the substrate comprises: depositing the n-type doped silicon film in an LPCVD chamber under conditions that a chamber pressure is 0.1-0.6 Torr, a flow ratio of silane gas and phosphine gas is 1:(0.02-0.6), and a temperature is 480-570° C.; or depositing the n-type doped silicon film in a PECVD chamber under conditions that a chamber pressure is 0.1-10 Torr, a flow ratio of silane gas and phosphine gas is 1:(0.01-0.8), and a temperature is 170-420° C.; or depositing the n-type doped silicon film in an APCVD chamber under conditions that a chamber pressure is 760 Torr, a flow ratio of silane gas and phosphine gas is 1:(0.01-0.9), and a temperature is lower than 580° C.

For example, the forming the n-type doped silicon film on the substrate at the first temperature and the performing the heat treatment on the n-type doped silicon film at the second temperature are performed in a same chamber.

For example, the etching and removing a portion of the n-type doped silicon film comprises: etching and removing a portion of the n-type doped silicon film of the substrate by using an alkali solution with a mass percentage of 0.5%-20% and an etching time of 1-10 minutes.

For example, the alkali solution is a potassium hydroxide solution, sodium hydroxide solution, tetramethyl ammonium hydroxide solution or ammonium hydroxide solution with a mass percentage of 5%, and the etching time is 3 minutes.

For example, before etching and removing a portion of the n-type doped silicon film and at a same time of or after performing the heat treatment on the n-type doped silicon film, the processing method further comprises: forming a silicon oxide layer on the n-type doped silicon film; and removing the silicon oxide layer on the portion of the n-type doped silicon film; after etching and removing the portion of the n-type doped silicon film, the processing method further comprises: removing the silicon oxide layer on the retained n-type doped silicon film; performing an annealing process on the n-type doped silicon film at a third temperature, and the third temperature is higher than the first temperature.

At yet another aspect, embodiments of the present disclosure provide a solar cell, obtained by any one of the above manufacturing method.

At yet another aspect, embodiments of the present disclosure provide a semiconductor device including: an n-type doped silicon film obtained by any one of the above processing method.

BRIEF DESCRIPTION OF THE DRAWINGS

In order to more clearly illustrate the technical solutions of the embodiments of the disclosure, the drawings of the embodiments will be briefly described in the following; it is obvious that the described drawings below are only related to some embodiments of the disclosure and thus are not limitative to the disclosure.

FIG. 5 is a flowchart of another exemplary manufacturing method of a solar cell according to an embodiment of the present disclosure;

DETAILED DESCRIPTION

Figure 1:
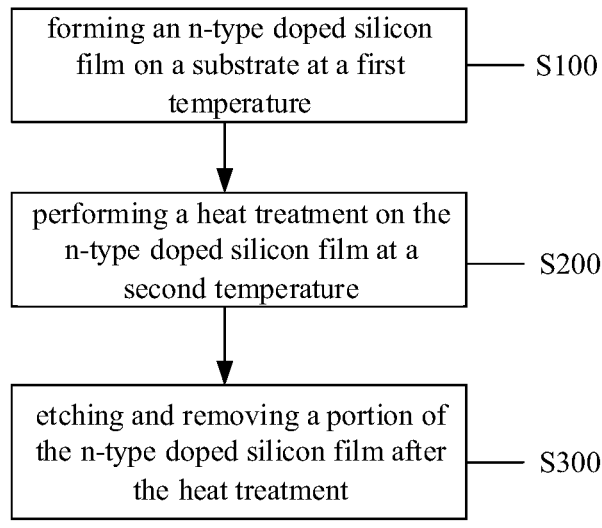
FIG. 1 is a flowchart of an exemplary processing method of an n-type doped silicon film according to an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "upper", "lower", "left" and "right" are only used to express the relative positional relationship. When the absolute position of the described object changes, the relative positional relationship may also change accordingly.

For industry, a solution that depositing of a silicon film and n-type doping, for example, phosphorus doping or arsenic doping can be completed in one machine and one step at the same time, not only reduce the processing steps to save time, but also reduce the investment in equipment. In-situ n-type doped silicon film technology is such a technology that can meet the above requirements, that is, gas containing n-type doping source, such as phosphorus doping source or arsenic doping source, is introduced while depositing a silicon film, so that the deposited silicon film contains specific content of doping source, such as phosphorus source or arsenic source.

The n-type doped silicon film may be an in-situ n-type doped silicon film, and the in-situ n-type doped silicon film may be formed by adopting a low pressure chemical vapor deposition (LPCVD), a plasma enhanced chemical vapor deposition (PECVD) and an atmospheric pressure chemical vapor deposition (APCVD). Upon an in-situ n-type doped silicon film being deposited, silane gas may be used as a deposition precursor of the silicon film, and a gas containing an n-type doping element, such as phosphine gas, may be used as an n-type doping source. Under certain temperature and pressure conditions, silane and phosphine are adsorbed on a surface of the silicon wafer and cracked to form an in-situ n-type doped silicon film.

Embodiments of the present disclosure provide a solar cell and a manufacturing method thereof, a processing method of an n-type doped silicon film, and a semiconductor device. In the processing method of an n-type doped silicon film, after forming an n-type doped silicon film at a first temperature, for example, a relatively low temperature, the n-type doped silicon film is subjected to a heat treatment at a second temperature higher than the first temperature, so that inactive doping atoms in the n-type doped silicon film are activated to form Si-doping atom bonds with Si, for example, Si—P bonds, because Si-doping atomic bonds, for example, Si—P bonds are easy to be corroded by alkali solution, so as to exponentially shorten the duration of removing the n-type doped silicon film by alkali solution in the subsequent steps, improve the corrosion speed and efficiency of the n-type doped silicon film by alkali solution, which is beneficial to industrial production, reducing the damage degree to a portion of the n-type doped silicon film that needs to be remained, improving the passivation effect of a solar cell using the n-type doped silicon film as a passivation film, and improving the battery performance.

Hereinafter, the technical solutions of the embodiments of the present disclosure will be described in detail with reference to the accompanying drawings.

FIG. 1 shows an example of a processing method of an n-type doped silicon film according to an embodiment of the present disclosure. As illustrated by FIG. 1, the processing method of the n-type doped silicon film according to an embodiment of the present disclosure includes:

S100: forming an n-type doped silicon film on a substrate at a first temperature;

S200: performing a heat treatment on the n-type doped silicon film at a second temperature; and S300: etching and removing a portion of the n-type doped silicon film after the heat treatment;

The first temperature is lower than the second temperature.

For example, in the embodiments of the present disclosure, the substrate may be any layer or substrate on which an n-type doped silicon film needs to be formed, such as a silicon wafer, a substrate in a semiconductor device, or a layer on which an n-type doped silicon film needs to be formed, such as an insulating layer, a passivation layer or a planarization layer, and the embodiments of the present disclosure are not limited thereto.

For example, in the processing method of the n-type doped silicon film, the substrate may be treated before forming the n-type doped silicon film on the substrate. For example, the substrate may be a silicon wafer, for example, an n-type monocrystalline silicon wafer, with a volume resistivity of 2.0 Ω·cm. For example, a surface of the silicon wafer may be treated with a tetramethyl ammonium hydroxide solution, a sodium hydroxide solution or a potassium hydroxide solution with a mass percentage of 15-40%, for example, 18-25% and further 20% with a temperature of 80° C., so as to obtain a silicon wafer with a smooth surface, which is convenient for measuring a film thickness.

For example, forming the n-type doped silicon film on the substrate may include forming the n-type doped silicon film by in-situ deposition on the substrate, and the n-type doped silicon film is an in-situ n-type doped silicon film.

Alternatively, forming the n-type doped silicon film on the substrate may include forming a silicon film on the substrate, and then implanting an n-type doping source, such as a phosphorus source, into the silicon film by ion implantation to form the n-type doped silicon film.

In the embodiment of the present disclosure, the n-type doped silicon film is a silicon film doped with n-type dopant, for example, the n-type dopant may be n-type dopant such as phosphorus or arsenic. For convenience of explanation, phosphorus is taken as an example, but it should be clear to those skilled in the art that other dopants such as arsenic are also applicable.

For example, in order to ensure the total n-type doping element content in the silicon film, for example, the phosphorus element content, a low-temperature deposition process may be selected to deposit the in-situ n-type doped silicon film. In the embodiment of the present disclosure, the in-situ deposition of the n-type doped silicon film on the substrate may be carried out by a low-temperature deposition process, for example, at a deposition temperature lower than 580° C.

For example, in the embodiment of the present disclosure, in-situ depositing the n-type doped silicon film on the substrate may include depositing an in-situ n-type doped silicon film with a thickness in a range of 2-2000 nm on the substrate at a temperature lower than 580° C. by using a silicon-containing gas and a gas containing n-type doping element as the reaction precursors; the first temperature is a temperature lower than 580° C.

For example, the silicon-containing gas is silane, and the gas containing n-type doping element may be phosphine, arsine, etc. In the in-situ deposition process, the flow rate of silane may be in the range of 400-1000 sccm, and the flow rate of phosphine may be in the range of 8-1000 sccm, and the flow ratio of the silane and the phosphine may be determined according to the actual process.

For example, the deposition temperature of the in-situ n-type doped silicon film is lower than 580° C., and the total n-type doping element content, for example, the phosphorus element content, in the deposited in-situ n-type doped silicon film is not less than $3*10^{20}$ atoms/cm$^3$.

For example, in the Tempress LPCVD chamber, an n-type doped silicon film with a thickness of 200 nm may be formed by in-situ deposition on the substrate at a temperature of 540° C., and the concentration of active doping atoms in the obtained n-type doped silicon film is between $3*10^{18}$-$1*10^{19}$ atoms/cm$^3$.

For example, the n-type doped silicon film may also be deposited at a temperature of 480-570° C., under the conditions of a silane flow rate of 600 sccm, a phosphine flow rate of 20 sccm, a chamber pressure of 0.2 Torr, and a deposition time of 120 minutes. A thickness of the silicon film is proportional to the deposition time, and a silicon film with a thickness of 100 nm may be obtained at this time.

For example, LPCVD, PECVD, APCVD or other vapor deposition methods may be used for in-situ deposition of the n-type doped silicon film on the substrate, and the embodiments of the present disclosure are not limited thereto.

For example, in the case where the in-situ n-type doped silicon film is deposited by means of LPCVD, the pressure in a chamber of the LPCVD deposition device may be 0.1-0.6 Torr, the flow ratio of silane and phosphine gas may be 1:(0.02-0.6), and the temperature may be lower than 580° C., for example, between 480-570° C.; in the case where the in-situ n-type doped silicon film is deposited by means of PECVD, the pressure in the chamber of PECVD deposition device may be 0.1-10 Torr, the flow ratio of silane and phosphine gas may be 1:(0.01-0.8), and the temperature may be less than 580° C., for example, between 170-420° C.; in the case where the in-situ n-type doped silicon film is deposited by means of APCVD, the pressure in the deposition chamber of APCVD deposition device may be normal pressure, that is, 760 Torr, the flow ratio of silane to phosphine may be 1:(0.01-0.9), and the temperature may be lower than 580° C.

For example, in the case where the in-situ n-type doped silicon film is deposited by means of LPCVD or PECVD, the reaction chamber is first evacuated, and when the required vacuum degree is reached, the above silicon-containing gas and the gas containing n-type doping element, for example, a reaction precursor of a phosphorus-containing gas, are introduced, and then the in-situ n-type doped silicon film is formed on the substrate by cracking and reaction.

For example, the n-type doped silicon film may be a single layer of n-type doped silicon film, or a stacked layer formed by an n-type doped silicon film sub-layer and an un-doped silicon film sub-layer which are alternately arranged, the staked layer may include 2-10 sub-layers, and the embodiments of the present disclosure are not limited thereto. A thickness of the un-doped silicon film sub-layer may be in the range of 2-1000 nm, while a thickness of the n-type doped silicon film sub-layer may be in the range of 2-1000 nm. In the stacked layer, the thickness of the n-type doped silicon film sub-layer may be equal to the thickness of the un-doped silicon film sub-layer, or the thickness of the n-type doped silicon film sub-layer may be larger than the thickness of the un-doped silicon film sub-layer, and the thicknesses of the n-type doped silicon film sub-layers may be equal to or not equal to each other, and the thicknesses of the un-doped silicon film sub-layers may be equal or not equal.

With regard to the n-type doped silicon film including the stacked layer formed by the n-type doped silicon film sub-layer and the un-doped silicon film sub-layer which are alternately arranged, in the subsequent process, the n-type doped silicon film may be annealed at a high temperature to activate the n-type doping atoms, such as phosphorus atoms, in this case, the n-type doping atoms will diffuse into the un-doped silicon film sub-layer to obtain the final n-type doped silicon film. The high-temperature annealing may be performed independently to make the n-type doping atoms diffuse into the un-doped silicon film sub-layer, or any other high-temperature process after forming the n-type doped silicon film will make the n-type doping atoms diffuse into the un-doped silicon film sub-layer.

For example, in the embodiment of the present disclosure, in-situ depositing the n-type doped silicon film on the substrate may include: in-situ depositing an n-type doped silicon film sub-layer on the substrate, and then depositing an un-doped silicon film sub-layer; or, first depositing an un-doped silicon film sub-layer on the substrate, and then in-situ depositing an n-type doped silicon film sub-layer; or, in-situ depositing an n-type doped silicon film sub-layer on the substrate, then depositing an un-doped silicon film sub-layer, and then in-situ depositing an n-type doped silicon film sub-layer in-situ deposition; or, first depositing an un-doped silicon film sub-layer on the substrate, then in-situ depositing an n-type doped silicon film sub-layer, then depositing an un-doped silicon film sub-layer, and repeating the above steps according to the number of sub-layers included in the stacked layer, and an in-situ deposited n-type doped silicon film with desired thickness is finally obtained.

For example, if an n-type doped silicon film with the thickness of 100 nm is to be deposited to passivate the back surface of n-type battery sheet, an n-type doped silicon film sub-layer with the thickness of 50 nm is formed by in-situ deposition, and then an un-doped silicon film sub-layer with the thickness of 50 nm is deposited; or, an un-doped silicon film sub-layer with the thickness of 50 nm is deposited first, and then an n-type doped silicon film sub-layer with the thickness of 50 nm is formed by in-situ deposition; or, a single-layer in-situ n-type doped silicon film with the thickness of 100 nm may be directly formed by in-situ deposition, and the required deposition time is 120 minutes; or, by increasing the proportion of phosphorus-containing gas, an in-situ n-type doped silicon film sub-layer with the thickness of 50 nm is first deposited, and then an un-doped silicon film sub-layer with the thickness of 50 nm is deposited, and the required deposition time is 80 minutes. Because the growth rate of the in-situ n-type doped silicon film sub-layer is lower than the growth rate of the un-doped silicon film sub-layer, the deposition time of the in-situ deposited n-type doped silicon film may be shortened by alternately arranging the n-type doped silicon film sub-layer and the un-doped silicon film sub-layer, and the machine productivity and process efficiency can be improved.

For example, the silicon film may include an amorphous silicon film, a polysilicon film, or a mixed film of an amorphous silicon film and a polysilicon film. By controlling process parameters, such as deposition process temperature, the amorphous silicon film is deposited at a low temperature, the polysilicon film is deposited at a relatively high temperature, and the mixed film of amorphous silicon film and polysilicon film is deposited at intermediate temperature between the low temperature and the relatively high temperature. For example, in the case where the in-situ depositing of the n-type doped silicon film is carried out by LPCVD process, silane gas (600 sccm) and phosphine gas (20 sccm) are introduced; upon the deposition temperature being lower than 570° C., for example, 500° C., an amorphous silicon film is obtained; upon the deposition temperature being higher than 590° C., a polysilicon film is obtained; upon the temperature being between 570-590° C., a mixed film of amorphous silicon film and polysilicon film is obtained, that is, some regions of the mixed film are amorphous silicon film, and some regions of the mixed film are polysilicon film.

For example, in the case where the n-type doped silicon film is used to prepare, for example, Topcon battery, in order to improve the passivation effect, a high-temperature annealing process may be adopted after the n-type doped silicon film is formed to activate the n-type doping element, such as phosphorus element, and in this process, all forms of silicon film will also be converted into the polysilicon film. Therefore, no matter what form the silicon film obtained when the n-type doped silicon film is deposited before the high-temperature annealing process, it will be transformed into an n-type doped polysilicon film such as a phosphorus-doped polysilicon film after the high-temperature annealing process. However, in the case where the n-type doped silicon film is used to prepare, for example, HIT (HJT) battery, the deposition temperature of the n-type doped silicon film is lower and an amorphous silicon film is obtained. And there is no subsequent high-temperature activation process, so that final form of the n-type doped silicon film in the battery is an n-type doped amorphous silicon film.

For example, in an embodiment of the present disclosure, performing the heat treatment on the n-type doped silicon film may include: performing the heat treatment on the n-type doped silicon film at a temperature in the range of 580-1000° C., for 5-200 minutes to increase the activity of inactive doping atoms in the n-type doped silicon film and transform the inactive doping atoms into active doping atoms, thereby forming a large number of Si-doping atom bonds, such as Si—P bonds, and reducing the content of the inactive doping atoms in the n-type doped silicon film, and the second temperature is 580-1000° C.

For example, the heat treatment temperature may be in the range of 580-720° C., or 590-750° C., and the time may be 10-60 minutes.

For example, the n-type doped silicon film may be subjected to the heat treatment at the temperature in the range of 580-700° C. for 15 minutes. After the heat treatment, the concentration of the active doping atoms in the n-type doped silicon film can reach $1*10^{20}$ atoms/cm$^3$, and the concentration of the active doping atoms gradually increases with the increase of heat treatment temperature. A person skilled in the art may adopt an appropriate processing temperature according to the required concentration of active doping atoms, and the embodiments of the present disclosure are not limited thereto.

It should be noted that, in the embodiment of the present disclosure, the n-type doped silicon film is a silicon film doped with an n-type dopant, for example, phosphorus or arsenic.

For the n-type dopant in the n-type doped silicon film, such as phosphorus, the phosphorus element in the n-type doped silicon film may be divided into active phosphorus and inactive phosphorus according to the chemical state of the element. The active phosphorus refers to the phosphorus element that forms a phosphorus-silicon chemical bond (Si—P) with silicon atom during the deposition process, and the inactive doping atom refers to the phosphorus element contained in the silicon film without forming a phosphorus-silicon chemical bond. Inventor(s) found that the content of active doping atoms, e.g. active phosphorus, in the n-type doped silicon films increases with the increase of deposition temperature of silicon film, that is, when the temperature increases, the activity of the inactive doping atoms, e.g. inactive phosphorus, will increase and will form Si-doping atom bonds e.g. Si—P bonds with silicon, and the inactive doping atoms will be converted into active doping atoms, e.g. active phosphorus, and form Si-doping atom bond. For example, the n-type doped silicon film with Si—P bond is easier to be eroded by alkali solution. Therefore, in the embodiment of the present disclosure, after the n-type doped silicon film is formed, the n-type doped silicon film is subjected to a heat treatment at a temperature higher than the deposition temperature, so that a portion of the inactive phosphorus elements are converted into active phosphorus elements. Phosphorus is explained as an example herein, it should be noted that other n-type dopants such as arsenic also represent the above situation. For example, the heat treatment of the n-type doped silicon film may be performed in-situ in the deposition chamber for in-situ depositing of the n-type doped silicon film, such as an LPCVD deposition chamber, a PECVD deposition chamber or an APCVD deposition chamber.

For example, silane and phosphine may be introduced into the chamber during in-situ depositing of the n-type doped silicon film, and the chamber pressure is 0.2 Torr and the process temperature is 540° C. When in-situ heat treatment is carried out in the deposition chamber, the introducting of silane and phosphine may be stopped, the chamber pressure is close to a bottom pressure of 0.01 Torr, and the process temperature is changed to 620° C.

Alternatively, the heat treatment of the n-type doped silicon film may include: moving the n-type doped silicon film out of the deposition chamber and placing the n-type doped silicon film in another chamber different from the deposition chamber for heat treatment, and the process parameters of in-situ heat treatment and heat treatment in another chamber may be the same. Compared with the heat treatment in another chamber, the in-situ heat treatment does not need to move a substrate deposited with the n-type doped silicon film, so it can shorten the process time, save the steps, avoid the damage or pollution of n-type doped silicon film during moving, and obtain n-type doped silicon film with better performance.

Alternatively, at the temperature in the range of 580-1000° C., the heat treatment of the n-type doped silicon film for 5-200 minutes may be carried out in an oxidizing atmosphere or a reducing atmosphere. Oxidizing atmosphere refers to that oxygen, atmosphere, water vapor, the mixed gas of the above three and nitrogen or any gas considered as oxidizing atmosphere may be introduced into the chamber. For example, when the mixed gas of oxygen and nitrogen is introduced, the flow ratio of oxygen and nitrogen may be (50-20000 sccm):(20000-50 sccm), and the embodiments of the present disclosure are not limited thereto, and any gas and flow ratio meeting the conditions of oxidizing atmosphere may be adopted. The reducing atmosphere may be that hydrogen, a mixed gas of hydrogen and nitrogen, a mixed gas of hydrogen and argon, etc, is introduced into the chamber. The embodiments of the present disclosure do not limit the flow ratio of each gas component in the mixed gas as long as the process requirements are met.

For example, at the temperature in the range of 580-1000° C., the heat treatment of the n-type doped silicon film for 5-200 minutes may be carried out at standard atmospheric pressure, or the appropriate chamber pressure may be selected according to the speed of reaction to perform the heat treatment on the n-type doped silicon film, and the embodiments of the present disclosure are not limited thereto.

For example, in an embodiment of the present disclosure, at the same time of or after performing heat treatment on the n-type doped silicon film, and before etching and removing a portion of the n-type doped silicon film, the processing method of the n-type doped silicon film may further include: forming a silicon oxide layer on the n-type doped silicon film, the silicon wafer will be oxidized to form a silicon oxide layer upon coming into contact with oxygen and moisture in the environment due to its high temperature when entering and leaving the chamber; or, in the case where oxygen and moisture exist in the heat treatment chamber, a silicon oxide layer will be formed on the n-type doped silicon film at the same time of the heat treatment.

For example, in an embodiment of the present disclosure, after forming a silicon oxide layer on the n-type doped silicon film and before etching and removing a portion of the n-type doped silicon film, the processing method further comprises: removing the silicon oxide layer and remaining the silicon oxide layer on the portion of the n-type doped silicon film finally left, for example, using a hydrofluoric acid solution with a mass percentage of 0.2%-40%, for example, 5% or 10%, to clean for 2 minutes, to remove the silicon oxide layer on the portion of the n-type doped silicon film to be removed or to remove the whole silicon oxide layer as required, which is not limited by the embodiments of the present disclosure, so as to facilitate to remove the portion of the n-type doped silicon film in the subsequent process.

For example, retaining the silicon oxide layer on the portion of the finally retained n-type doped silicon film is to protect the portion of the finally retained n-type doped silicon film when removing a portion of the n-type doped silicon film.

For example, in an embodiment of the present disclosure, etching and removing a portion of the n-type doped silicon film may include: etching and removing a portion of the n-type doped silicon film with a low-concentration alkali solution.

For example, the low-concentration alkali solution may be an alkali solution with a mass percentage of 0.5%-20%, for example, 5%, the alkali solution may be potassium hydroxide solution, sodium hydroxide solution, tetramethyl ammonium hydroxide solution or ammonium hydroxide solution, and the etching time may be 1-10 minutes.

For example, in the embodiment of the present disclosure, in the case where a low-concentration alkali solution is used to etch and remove the n-type doped silicon film, the etching rate of the n-type doped silicon film with low-concentration alkali solution is accelerated with the increase of the temperature of the heat treatment on the n-type doped silicon film, and the etching rate can be multiplied with the increase of the heat treatment temperature. Table 1 shows the etching rates of the n-type doped silicon film at different heat treatment temperatures, and Table 1 shows the results of taking phosphorus-doped silicon film as an example. The trend is the same for arsenic and other n-type dopants, but the value may be slightly different. As illustrated by Table 1, by using TMAH alkali solution with a mass percent of 5% to etch the phosphorus-doped silicon film for 1 minutes, the etching rate of phosphorus-doped silicon film is 21.9 nm/min when the heat treatment temperature is 25° C., and gradually increases with the increase of heat treatment temperature. When the heat treatment temperature reaches 700° C., the etching rate of phosphorus-doped silicon film is 86.2 nm/min, which is over four times of the etching rate at the temperature of 25° C.

TABLE 1

| | etching rate of n-type doped silicon film at different heat treatment temperatures. | | |
|---|---|---|---|
| Heat treatment temperature(° C.) | Thickness of the in-situ n-type doped silicon film before etching (nm) | Thickness of the in-situ n-type doped silicon film after etching (nm)/ (5% TMAH 1 min) | Etching rate (nm/min) |
| 25(room temperature) | 98.5 | 76.6 | 21.9 |
| 580 | 99.6 | 75.0 | 24.6 |
| 600 | 98.7 | 41.1 | 57.6 |
| 620 | 100.4 | 29.1 | 71.3 |
| 700 | 98.7 | 12.5 | 86.2 |

For example, in an embodiment of the present disclosure, after etching and removing a portion of the n-type doped silicon film, the processing method of the n-type doped silicon film further includes: removing the silicon oxide layer on the remaining n-type doped silicon film and annealing the n-type doped silicon film at a third temperature. For example, the third temperature is higher than the first temperature, the third temperature may be in the range of 870-970° C., and further in the range of 890-940° C., such as 910° C., and the time may be 30 minutes. After annealing, the concentration of n-type doping element, such as phosphorus, in the silicon film can reach more than $3*10^{20}$ atoms/cm$^3$.

Hereinafter, an exemplary flow of the processing method of the n-type doped silicon film according to the embodiment of the present disclosure is provided to illustrate that the processing method of the n-type doped silicon film according to the embodiment of the present disclosure can significantly shorten the etching rate, and the exemplary flow of the processing method includes:

S1110: performing a surface treatment on the substrate. The substrate may be an n-type monocrystalline silicon wafer with a volume resistivity of 2.0 Ω·cm. A surface of the silicon wafer is treated with a tetramethyl ammonium hydroxide solution (TMAH) with a mass percentage of 20% at 80° C. to obtain a polished silicon wafer surface, which is convenient for subsequently measuring a film thickness.

For example, KOH or NaOH solution with a mass percentage of 20% at 80° C. may also be used, and the mass percentage of the solution may be in the range of 15-40%, and further in the range of 18-25%, for example, 20%, which may be selected according to actual needs, and the embodiments of the present disclosure are not limited thereto.

S1120: depositing an in-situ n-type doped silicon film. In-situ phosphorus doped silicon film is deposited on the silicon wafer surface by a Tempress LPCVD furnace tube. The thickness of the in-situ phosphorus doped silicon film is about 100 nm. The deposition temperature is 540° C. In this case, as illustrated by FIG. 2, it can be obtained by directly performing an EVC test after deposition that the concentration of active doping atoms in the silicon film is between $3*10^{18}$-$1*10^{19}$ atoms/cm$^3$.

S1130: performing a heat treatment on the in-situ phosphorus doped silicon film. The in-situ phosphorus doped silicon film is performed a heat treatment in a furnace tube at a temperature in the range of 580-700° C. for 15 minutes. FIG. 2 shows the relationship graph between the depth of phosphorus doped silicon film and the concentration of active doping atoms at different heat treatment temperatures. It can be seen from FIG. 2 that after heat treatment at the temperature of 620° C. and 700° C., the concentration of active doping atoms in phosphorus doped silicon film can reach more than $1*10^{20}$ atoms/cm$^3$ at a depth of 0-0.10 um, and it can be seen from FIG. 2 that the concentration of active doping atoms gradually increases with the increase of heat treatment temperature.

For example, a treatment temperature of 620° C. may be selected. A heat treatment time is 15 minutes.

Figure 2:
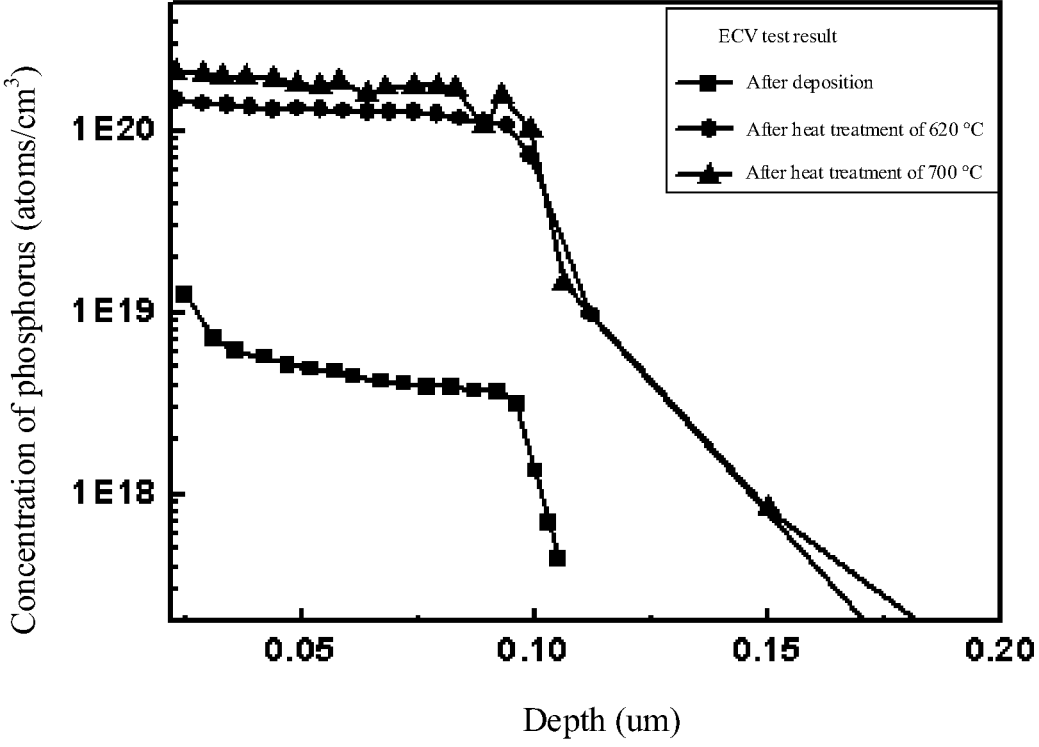
FIG. 2 is a graph showing a relationship between a depth of an n-type doped silicon film and a concentration of active doping atoms at different heat treatment temperatures according to an embodiment of the present disclosure.

FIG. 2 is a graph given by taking the phosphorus doped silicon film as an example, but for other n-type doping elements such as arsenic, the same is that: with the increase of heat treatment temperature, the concentration of the active doping atoms gradually increases, but the values are slightly different.

S1140: cleaning the in-situ phosphorus doped silicon film after the heat treatment. A 5% hydrofluoric acid solution is used to remove the silicon oxide layer on the surface.

For example, the silicon wafer may also be cleaned with 10% hydrofluoric acid solution for 2 minutes.

S1150: etching the in-situ phosphorus doped silicon film. The in-situ phosphorus doped silicon film after heat treatment is etched by using 5% TMAH solution for 1 minute, to remove a portion of the phosphorus doped silicon film.

The process may also include: removing the silicon oxide layer on the remaining n-type doped silicon film.

Figure 3:
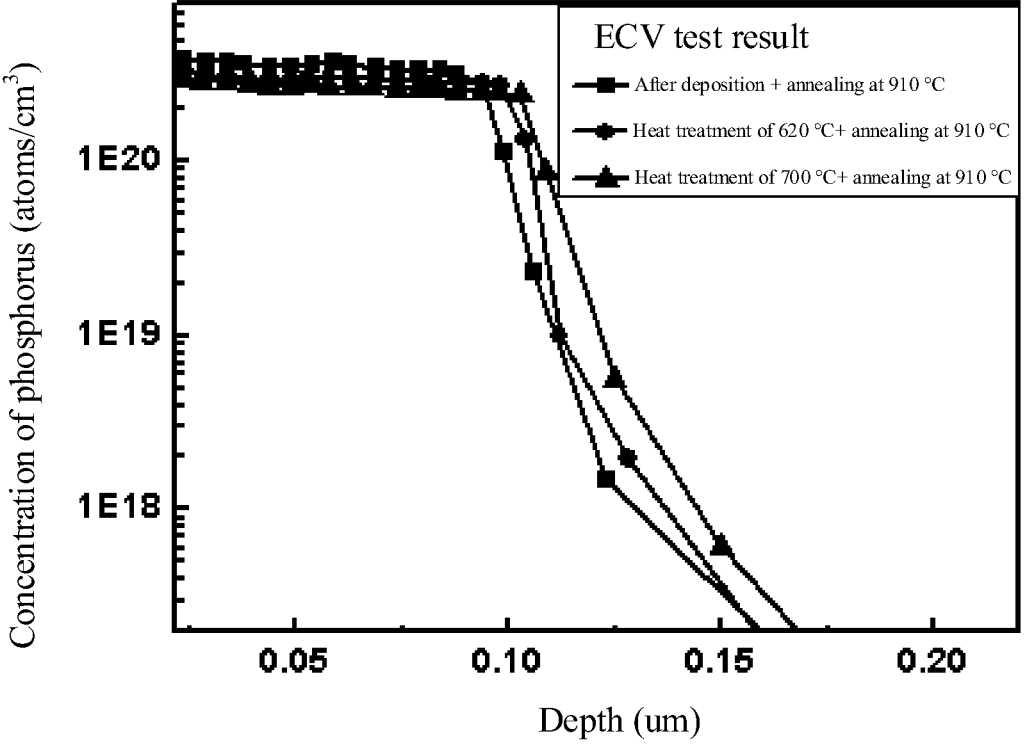
FIG. 3 is a graph showing a relationship between a depth of an n-type doped silicon film and a concentration of active doping atoms after annealing at different heat treatment temperatures according to an embodiment of the present disclosure.

S1160: activating phosphorus elements in the in-situ n-type doped silicon film at high temperature. The phosphorus doping element in the in-situ n-type doped silicon film is activated by a furnace tube at a high temperature, activating temperature is 910° C. and an activating time is 30 minutes. FIG. 3 shows the relationship graph between a depth of the n-type doped silicon film and the concentration of the active doping atoms after annealing at different heat treatment temperatures. It can be seen from FIG. 3 that the concentration of the active doping atoms in the silicon film after high-temperature annealing can reach over $3*10^{20}$ atoms/cm$^3$, and such phosphorus concentration may be used in the field of solar cell to passivate the surface of n-type silicon wafer.

In addition, for comparison, FIG. 3 shows three kinds of curves, the first one is a curve of the relationship between the depth of n-type doped silicon film and phosphorus concentration after directly annealing the n-type doped silicon film at 910° C. without heat treatment, the second one is a curve of the relationship obtained by annealing the n-type doped silicon film after the heat treatment of the n-type doped silicon film at 620° C., the third one is a curve of the relationship obtained by annealing the n-type doped silicon film after the heat treatment of the n-type doped silicon film at 700° C. It can be seen from FIG. 3 that, compared with the n-type doped silicon film without a heat treatment, the heat treatment will not affect the phosphorus concentration in the final n-type doped silicon film, which does not affect the passivation effect.

For arsenic and other N-type doping elements, compared with the n-type doped silicon film without heat treatment, the heat treatment process will not affect the concentration of N-type doping elements in the final n-type doped silicon film, and will not affect the passivation effect.

Therefore, in the embodiment of the present disclosure, the deposited n-type doped silicon film is subjected to heat treatment, so that the concentration of the active doping atoms in the n-type doped silicon film is increased, which can shorten the etching time several times for removing a portion of the n-type doped silicon film with low-concentration alkali solution and increase the etching rate. Moreover, such heat treatment will not affect the concentration of doping atoms, such as phosphorus concentration, in the n-type doped silicon film finally obtained by high-temperature annealing, and will not affect the passivation effect of the n-type doped silicon film.

For the deposition of n-type doped silicon film, the deposition temperature has a significant effect on the content of n-type doping element in the silicon film, that is, the content of n-type doping element, such as phosphorus, decreases sharply with the increase of deposition temperature. When the content of n-type doping element, such as phosphorus, in n-type doped silicon film is greatly reduced, the downward trend of energy band bending of the film decreases, in this case, the ability of the interface to extract and transmit electrons in n-type doped silicon wafer and to block holes becomes weak, thus destroying the passivation effect. Therefore, in the embodiment of the present disclosure, the n-type doped silicon film is formed at a lower temperature, for example, below 580° C., thereby ensuring the total n-type doping element, for example, phosphorus content in the silicon film. Furthermore, the inactive n-type doping element in the n-type doped silicon film is converted into an active n-type doping element by a subsequent heat treatment process at a slightly higher temperature, for example, a heat treatment process at 580-1000° C., so that the content of the active n-type doping element in the n-type doped silicon film increases with the increase of the film heat treatment temperature.

In the embodiment of the present disclosure, a portion of the n-type doped silicon film is removed and a portion is retained for high-temperature annealing. In the actual process, due to the limitation of process conditions, the n-type doped silicon film will inevitably be formed in a region where it is not needed to deposit the n-type doped silicon film. In order to remove such unneeded n-type doped silicon film and retain the n-type doped silicon film in the required region, a process for removing the n-type doped silicon film is needed. In the embodiment of the present disclosure, the n-type doped silicon film is subjected to a heat treatment, so that the removing time of subsequently removing unneeded n-type doped silicon films is shortened, and the effect is improved; and the performance of the retained n-type doped silicon film, such as passivation performance, is not affected by such heat treatment.

Figure 4:
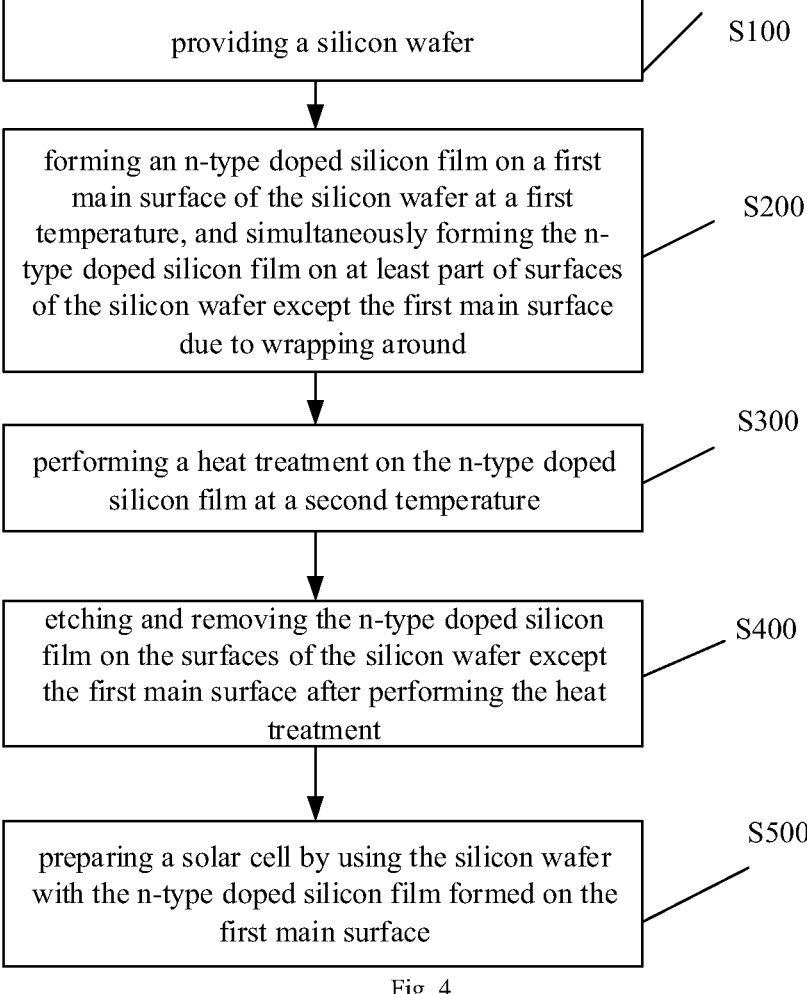
FIG. 4 is a flowchart of an exemplary manufacturing method of a solar cell according to an embodiment of the present disclosure.
Figure 6:
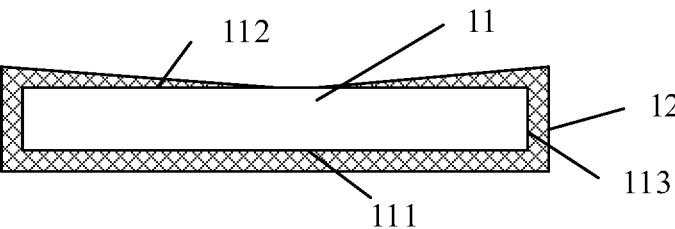
FIG. 6 is a structural diagram of a structure obtained after one step in an exemplary manufacturing method of a solar cell according to an embodiment of the present disclosure.

On the other hand, the embodiment of the present disclosure also provides a manufacturing method of a solar cell, in which the n-type doped silicon film is used as a passivation layer, as illustrated by FIG. 4, and an exemplary manufacturing method includes the following steps:

S100: providing a silicon wafer;

S200: forming an n-type doped silicon film on a first main surface of the silicon wafer at a first temperature, and simultaneously forming the n-type doped silicon film on at least a portion of surfaces of the silicon wafer except the first main surface due to wrapping around. As illustrated by FIG. 6, an n-type doped silicon film 12 is formed on the first main surface 111 of the silicon wafer 11, and at the same time, the n-type doped silicon film 12 is also formed on other surfaces, such as the second main surface 112 and the side surface 113, due to wrapping around.

S300: performing a heat treatment on the n-type doped silicon film at a second temperature;

S400: etching and removing the n-type doped silicon film on the surfaces of the silicon wafer except the first main surface after performing the heat treatment;

S500: preparing a solar cell by using the silicon wafer with the n-type doped silicon film formed on the first main surface, The first temperature is lower than the second temperature.

Alternatively, as illustrated by FIG. 5, another exemplary manufacturing method of a solar cell according to an embodiment of the present disclosure includes:

S1000: providing a silicon wafer;

S2000: forming an n-type doped silicon film on a first main surface of the silicon wafer at a first temperature, and simultaneously forming the n-type doped silicon film on at least a portion of surfaces of the silicon wafer except the first main surface due to wrapping around. As illustrated by FIG. 6, an n-type doped silicon film 12 is formed on the first main surface 111 of the silicon wafer 11, and at the same time, the n-type doped silicon film 12 is also formed on other surfaces, such as the second main surface 112 and the side surface 113, due to wrapping around.

S3000: performing a heat treatment on the n-type doped silicon film at a second temperature;

S4000: etching and removing the n-type doped silicon film on the surfaces of the silicon wafer except the first main surface after performing the heat treatment;

S5000: performing an annealing process on the n-type doped silicon film formed on the first main surface at a third temperature, after etching and removing the n-type doped silicon film on the surfaces of the silicon wafer except the first main surface;

S6000: preparing a solar cell by using the silicon wafer with the n-type doped silicon film formed on the first main surface, The first temperature is lower than the second temperature and the third temperature is higher than the first temperature.

As for the battery sheet, the silicon film is not suitable for being arranged at a light receiving surface (front surface) of the battery sheet because it has a relatively wide band gap and thus strongly absorbs visible light, and is more suitable for being applied to, for example, the back surface of the n-type battery sheet. When depositing the n-type doped silicon film, it is inevitable that the n-type doped silicon film will be wrapped around the light receiving surface and the side surface of the n-type battery sheet because of the easy diffusion of gas. This kind of wrapped around n-type doped silicon film not only has the disadvantage of strong light absorption, but also the n-type doping atoms in the film will diffuse into the silicon substrate during the subsequent high-temperature annealing, which will damage the structures of the battery such as P-N junction. Therefore, it is needed to remove the wrapped around n-type doped silicon film after the n-type doped silicon film is deposited.

For example, the silicon wafer here may be an n-type silicon wafer or a p-type silicon wafer, which is not limited by the embodiments of the present disclosure. The first main surface may be the back surface of the n-type silicon wafer, i.e., a surface opposite to the light, and the surfaces except the first main surface may be the front surface, i.e., the light receiving surface and the side surface of the n-type silicon wafer.

For example, before forming the n-type doped silicon film, the manufacturing method of the solar cell may further include: performing a surface treatment on the silicon wafer, for example, cleaning and texturing, so as to obtain the silicon wafer meeting the need.

In an embodiment of the present disclosure, forming the n-type doped silicon film on the first main surface of the silicon wafer and simultaneously forming the n-type doped silicon film on at least a portion of the surfaces except the first main surface due to wrapping around includes: in-situ depositing the n-type doped silicon film on the first main surface of the silicon wafer and simultaneously in-situ depositing the n-type doped silicon film on at least a portion of the surfaces of the silicon wafer except the first main surface due to wrapping around, the n-type doped silicon film is an in-situ n-type doped silicon film; or, depositing a silicon film on the first main surface of the silicon wafer, and then implanting n-type doping atoms into the silicon film to obtain the n-type doped silicon film, which is not limited by embodiments of the present disclosure.

For example, in-situ depositing the n-type doped silicon film on the first main surface of the silicon wafer and simultaneously in-situ depositing the n-type doped silicon film on at least a portion of the surfaces of the silicon wafer except the first main surface due to wrapping around includes: depositing an in-situ n-type doped silicon film with a thickness in the range of 2-2000 nm on the substrate, at a temperature lower than 580° C. by using a silicon-containing gas and a gas containing n-type doping element as the reaction precursors. For example, the silicon-containing gas may be silane, and the gas containing n-type doping element may be phosphine. The method and process parameters of in-situ deposition of the n-type doped silicon film in this embodiment are completely consistent with those disclosed in the above-described processing method of the n-type doped silicon film. For brevity and avoidance of repetition, the repeated portions will be omitted herein, but only the differences between them will be described.

For example, an n-type doped silicon film with the thickness of 100 nm may be obtained at a temperature of 480-570° C., a silane flow rate of 600 sccm, a phosphine flow rate of 20 sccm, a chamber pressure of 0.2 Torr, and a deposition time of 120 minutes.

In the same way, LPCVD, PECVD, APCVD or other vapor deposition methods may be used for in-situ depositing of the n-type doped silicon film, and corresponding specific process parameters may refer to the description in the embodiment of the processing method of phosphorus-doped silicon film.

For example, the n-type doped silicon film may be a single layer of n-type doped silicon film, or a stacked layer formed by an n-type doped silicon film sub-layer and an un-doped silicon film sub-layer which are alternately disposed, and the stacked layer may include 2-10 sub-layers. For other descriptions and examples, please refer to the description in the embodiment of the processing method of n-type doped silicon film.

For example, the silicon film may include an amorphous silicon film, a polysilicon film, or a mixed film of amorphous silicon film and polysilicon film. By controlling the process parameters, such as deposition process temperature, an amorphous silicon film is deposited at a low temperature, a polysilicon film is deposited at a relatively high temperature, and a mixed film of amorphous silicon film and polysilicon film is deposited at an intermediate temperature between the lower temperature and the relatively high temperature. For example, in the case where the in-situ depositing of n-type doped silicon film is carried out by using LPCVD process, silane gas (600 sccm) and phosphine gas (20 sccm) are introduced. When the deposition temperature is lower than 570° C., for example, 500° C., the amorphous silicon film is obtained; when the deposition temperature is higher than 590° C., the polysilicon film is obtained; when the temperature is between 570-590° C., a mixed film of amorphous silicon film and polysilicon film is obtained, that is, some regions of the mixed film are amorphous silicon film, and some regions of the mixed film are polysilicon film.

For example, in an embodiment of the present disclosure, performing a heat treatment on the n-type doped silicon film may include: performing a heat treatment on the n-type doped silicon film at a temperature in the range of 580-1000° C. for 5-200 minutes, to increase the activity of inactive n-type doping element in the n-type doped silicon film and convert the inactive n-type doping element into active n-type doping element to form a large number of Si-n-type doping element bonds, such as Si—P bonds, and reduce the content of the inactive doping atoms in the n-type doped silicon film.

For example, the heat treatment temperature may be in the range of 580-720° C. or 590-750° C.

Alternatively, in order to avoid the n-type doping element in the wrapped around n-type doped silicon film on the surfaces except the first main surface from diffusing into the silicon substrate and damaging the battery P-N junction and other structures during the heat treatment of the n-type doped silicon film, the heat treatment of the n-type doped silicon film may be performed at a lower heat treatment temperature, for example, at a temperature in the range of 590-750° C. or 580-720° C.

Alternatively, in order to prevent n-type doping atoms in the wrapped around n-type doped silicon film from diffusing into the silicon substrate while keeping the heat treatment temperature high enough, before forming the n-type doped silicon film on the first main surface of the silicon wafer, the manufacturing method of the solar cell may further comprise: forming a barrier layer on the surfaces of the silicon wafer except the first main surface, for example, forming a barrier layer such as a silicon oxide film, a boron-doped silicon oxide film, a silicon nitride film, etc.

For example, at a process temperature of 880° C., oxygen of 3000 sccm may be introduced into the heat treatment chamber, and a silicon oxide barrier layer is formed on the surfaces except the first main surface before depositing the n-type doped silicon film; or, the boron-doped silicon oxide formed by preparing the PN junction when manufacturing the solar cell may be retained as the barrier layer; or, a PECVD process is adopted, and silane and ammonia are used as reaction gases at a temperature of 420° C. to form a silicon nitride barrier layer. The formation of the barrier layer may adopt any other suitable process conditions for forming the above layers, which is not limited by the embodiments of the present disclosure.

It should be noted that, when the n-type doped silicon film of the embodiment of the present disclosure is used as a passivation layer of a solar cell, the deposition and heat treatment of the n-type doped silicon film and the removing of a portion of the n-type doped silicon film may be performed when the main structure of the solar cell, such as a PN junction, has been manufactured, and after the n-type doped silicon film has been processed, the structure such as the electrode of the solar cell may be manufactured on the n-type doped silicon film. The embodiment of the present disclosure is not limited thereto, and the manufacturing sequence may be adjusted.

For example, the thickness of the barrier layer may range from 30 nm to 500 nm, for example, from 35 nm to 200 nm, and further from 40 nm to 100 nm.

For example, for the exemplary manufacturing method of FIG. 4 and another exemplary manufacturing method shown in FIG. 5, the manufacturing method of FIG. 5 adds a step: performing an annealing process on the n-type doped silicon formed on the first main surface at a third temperature, and the purpose of this step is to activate the n-type doping element in the silicon film, such as phosphorus or arsenic, to obtain an n-type doped silicon film with better passivation effect. In the manufacturing method, when a barrier layer is formed on the surfaces except the first main surface to prevent n-type doping element in the wrapped around n-type doped silicon film from diffusing into the silicon substrate during heat treatment, the heat treatment of the n-type doped silicon film may be carried out at a higher temperature, for example, at a temperature greater than 870-970° C., and the n-type doping element in the silicon film is fully activated at the same time of heat treatment. The subsequent step of performing the annealing process on the n-type doped silicon formed on the first main surface at the third temperature may be omitted, and the same passivation effect as other exemplary manufacturing methods including this step can be obtained, and the separate step of annealing at high temperature to activate the n-type doping element is omitted, thus saving the process time and improving the process efficiency.

Alternatively, in the case where the barrier layer is formed on the surfaces except the first main surface in the manufacturing method and the subsequent heat treatment temperature is relatively high, in order to obtain a better passivation effect, the step of preforming an annealing process on the n-type doped silicon formed on the first main surface at the third temperature may also be included, which is not limited by the embodiments of the present disclosure, and the skilled person can choose whether to perform this step as needed.

Figure 7:
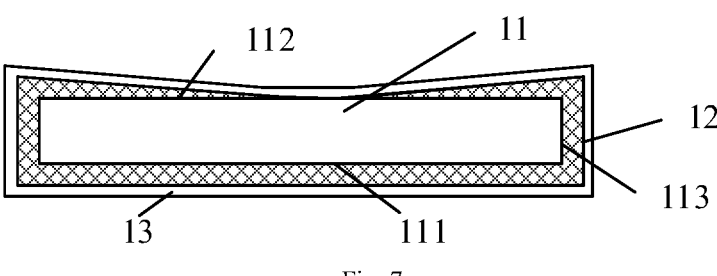
FIG. 7 is a structural diagram of a structure obtained after the step of FIG. 6 in an exemplary manufacturing method of a solar cell according to an embodiment of the present disclosure.

For example, in an embodiment of the present disclosure, at the same time of or after performing the heat treatment on the n-type doped silicon film and before etching and removing the n-type doped silicon film on the surfaces of the silicon wafer except the first main surface, the manufacturing method of the solar cell may further include: forming a silicon oxide layer on the n-type doped silicon film, the silicon wafer will be oxidized to form a silicon oxide layer upon coming into contact with oxygen and moisture in the environment due to its high temperature when entering and leaving the chamber; or, in the case where oxygen and moisture exist in the heat treatment chamber, a silicon oxide layer will be formed on the n-type doped silicon film at the same time of the heat treatment. As illustrated by FIG. 7, a silicon oxide layer 13 is formed on the n-type doped silicon film 12.

In the embodiment of the present disclosure, forming a silicon oxide layer on the n-type doped silicon film refers to a forming step which is intentionally performed or a step of naturally forming a silicon oxide layer when corresponding conditions exist in other processes, and the embodiment of the present disclosure is not limited thereto.

In an embodiment of the present disclosure, before etching and removing the n-type doped silicon film on the surfaces of the silicon wafer except the first main surface, the manufacturing method of the solar cell further includes: removing the silicon oxide layer on the surfaces of the substrate except the first main surface while retaining the silicon oxide layer on the first main surface, so that the n-type doped silicon film on the surfaces except the first main surface is exposed for subsequent removal treatment.

Figure 8:
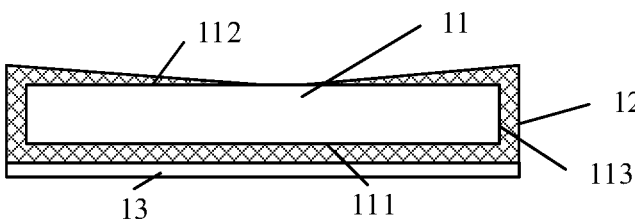
FIG. 8 is a structural diagram of a structure obtained after the step of FIG. 7 in an exemplary manufacturing method of a solar cell according to an embodiment of the present disclosure.

As illustrated by FIG. 8, a hydrofluoric acid solution is used to remove the silicon oxide layer on the surfaces of the substrate except the first main surface while retaining the silicon oxide layer on the first main surface of the substrate, and a hydrofluoric acid solution with a mass percentage of 0.2%-40%, such as a 5%, may be used for cleaning treatment for 2 minutes. The removing may be carried out on the machine of cleaning equipment, in which a cleaning tank is arranged in the machine of cleaning equipment and a hydrofluoric acid solution is provided in the cleaning tank, and a roller is arranged at a position near a liquid surface of the hydrofluoric acid solution of the tank surface. Most of the roller is immersed in the hydrofluoric acid solution, while a small portion of the upper surface is not immersed in the hydrofluoric acid solution, so that the roller rolls and drives the silicon wafer. The silicon oxide film is removed at a place where a bottom of the silicon wafer contacts the acid solution, and the oxide layer at a top which does not contact the hydrofluoric acid solution remains, thus obtaining the silicon wafer with the silicon oxide layer 13 retained on the first main surface as illustrated by FIG. 8.

For example, in an embodiment of the present disclosure, etching and removing the n-type doped silicon film on the surfaces of the silicon wafer except the first main surface may include: etching and removing a portion of the n-type doped silicon film by using a low-concentration alkali solution.

For example, the low-concentration alkali solution may be an alkali solution with a mass percentage of 0.5-20%, for example, 5%, which may be potassium hydroxide solution, sodium hydroxide solution, tetramethyl ammonium hydroxide solution or ammonium hydroxide solution, and the etching time may be 1-10 minutes, for example, 5% TMAH solution may be used to etch and remove the n-type doped silicon film for 3 minutes. For example, other parts that may be adopted may refer to the description about the processing method of n-type doped silicon film, which will not be described here.

According to the description in the processing method of n-type doped silicon film, as illustrated by Table 1, in the embodiment of the present disclosure, because the formed n-type doped silicon film is subjected to the heat treatment, in the case where the n-type doped silicon film is etched and removed by using a low-concentration alkali solution, the etching rate of the n-type doped silicon film by using the low-concentration alkali solution is accelerated with the increase of the heat treatment temperature, and the etching rate can be multiplied with the increase of the heat treatment temperature.

For example, after etching and removing the n-type doped silicon film on the surfaces of the substrate except the first main surface and before preparing the solar cell by using the silicon wafer with the n-type doped silicon film formed on the first main surface, the manufacturing method of the solar cell further includes: removing the silicon oxide layer on the n-type doped silicon film of the substrate by using an acid solution.

Figure 9:
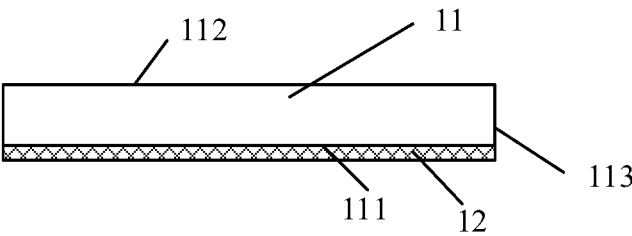
FIG. 9 is a structural diagram of a structure obtained after the step of FIG. 8 in an exemplary manufacturing method of a solar cell according to an embodiment of the present disclosure.

For example, a hydrofluoric acid solution with a mass percentage of 0.2%-40%, for example, 5%, may be used for cleaning treatment for 2 minutes, and the structure obtained after removing the silicon oxide layer is as illustrated by FIG. 9, where only the first main surface of the silicon wafer is provided with an n-type doped silicon film 12.

Alternatively, before forming the n-type doped silicon film on the first main surface of the silicon wafer, the manufacturing method of the solar cell further includes: forming a passivation tunneling layer on the first main surface of the silicon wafer, for example, the passivation tunneling layer may be a silicon oxide layer with a thickness of about 1.7 nm.

Alternatively, after removing the silicon oxide layer on the n-type doped silicon film of the substrate by using an acid solution and before preparing the solar cell by using the silicon wafer with the n-type doped silicon film formed on the first main surface, the manufacturing method further includes: performing an annealing process on the n-type doped silicon film at a third temperature to activate n-type doping element in the n-type doped silicon film, such as phosphorus.

For example, the third temperature may be a temperature higher than the first temperature, such as 870-970° C., and further a temperature in the range of 890-940° C., such as 910° C., so as to fully activate the n-type doping element, thereby providing a better passivation effect.

Hereinafter, an example flow of a solar cell manufacturing method according to an embodiment of the present disclosure is provided, which is described in the following:

S2100: depositing an in-situ n-type doped silicon film. A silicon wafer to be deposited is prepared, two silicon wafers are placed back to back in a slot of a quartz boat, to expose the back surface of the battery sheet to be deposited in the deposition chamber, and deposit the in-situ phosphorus-doped silicon film in a Tempress LPCVD machine, with the deposition temperature of 540° C. and the film thickness of 200 nm. As illustrated by FIG. 6, the back surface of the silicon wafer is coated with an in-situ n-type doped silicon film, and at the same time, the side surface and a portion of the front surface of the silicon wafer are also coated with an in-situ n-type doped silicon film (which is called as the wrapped around in-situ n-type doped silicon film).

S2200: performing a heat treatment on the in-situ n-type doped silicon film. The in-situ n-type doped silicon film is subjected to a heat treatment in a furnace tube at a temperature of 650° C. for 15 minutes. After the heat treatment, a silicon oxide layer is formed on surfaces of the in-situ phosphorus doped silicon film and the silicon wafer (as illustrated by FIG. 7).

S2300: cleaning the wrapped around silicon film. 5% hydrofluoric acid solution is used to remove the silicon oxide film on a surface of the wrapped around in-situ n-type doped silicon film, so that the wrapped around in-situ n-type doped silicon film is exposed, while the silicon oxide protective layer 13 on the surface of the in-situ n-type doped silicon film on the back surface of the silicon wafer remains (as illustrated by FIG. 8).

S2400: etching and removing the wrapped around in-situ n-type doped silicon film. 5% TMAH solution is used to etch the wrapped around in-situ n-type doped silicon film on which the silicon oxide layer is removed after heat treatment, and the etching time is 3 minutes. Then, the silicon wafer is cleaned by using 5% hydrofluoric acid solution, to remove the retained silicon oxide layer, and obtain a silicon wafer structure passivated by the in-situ phosphorus-doped silicon film on the back surface (as illustrated by FIG. 9).

In the steps S2100-S2400, the phosphorus-doped silicon film is taken as an example of the n-type doped silicon film. For other n-type doped silicon films, the specific process parameters may be slightly different, but the process flow is consistent and the obtained structure is consistent.

The above is only an exemplary process, but it is not a limitation to the embodiments of the present disclosure. The person skilled in the art may combine any process conditions in any steps disclosed in the specification according to actual needs.

In the embodiment of the present disclosure, by forming the n-type doped silicon film at a lower temperature, the concentration of n-type doping element in the formed n-type doped silicon film can be increased, and the total n-type doping element content in the silicon film can be ensured. Furthermore, the inactive n-type doping element in the n-type doped silicon film can be converted into active n-type doping element by a subsequent heat treatment process with a slightly higher temperature, for example, a heat treatment process at 580-1000° C., so that the content of active n-type doping element in the n-type doped silicon film increases with the increase of the film heat treatment temperature, thereby shortening the removing time for subsequent removing the n-type doped silicon film and improving the efficiency. Besides, the heat treatment will not affect the performance, such as passivation performance, of the retained n-type doped silicon film.

An embodiment of the present disclosure also provides a solar cell obtained by adopting any of the above-mentioned manufacturing methods of the solar cell, in which an n-type doped silicon film is manufactured as a passivation film by adopting the above-mentioned method. For example, the thickness of the n-type doped silicon film may be 60-300 nm.

Because the silicon film is subjected to the heat treatment after forming the n-type doped silicon film, the inactive n-type doping element which adversely affect the etching time of subsequently removing the n-type doped silicon film is reduced, thereby shortening the etching time, and avoiding the damage caused by the n-type doped silicon film on the back surface of the battery sheet being placed in alkali solution for a long time when removing the wrapped around n-type doped silicon film, thus minimizing the damage of the n-type doped silicon film on the back surface of the battery sheet, ensuring the passivation effect and improving the process efficiency and productivity.

An embodiment of the present disclosure also provides a semiconductor device, the semiconductor device adopts an n-type doped silicon film obtained by the above method according to the embodiment of the present disclosure, for example, the n-type doped silicon film may be used for manufacturing a gate electrode of a thin film transistor and a resistor. In the case where the n-type doped silicon film is used for the gate electrode, the film thickness may be 100-5000 nm, and the person skilled in the art may select an appropriate film thickness according to actual needs.

Embodiments of the present disclosure provide a processing method of an n-type doped silicon film, a solar cell and a manufacturing method thereof, and a semiconductor device. By forming the n-type doped silicon film at a lower temperature, the content of n-type doping element in the n-type doped silicon film can be ensured, and by subsequent heat treatment, the content of inactive n-type doping element can be reduced, thereby increasing the etching rate of etching and removing the n-type doped silicon film, reducing damage to the n-type doped silicon film to be retained, improving passivation effect, improving process efficiency and productivity, and being beneficial to industrial production.

The following points need to be explained:

(1) The drawings of the embodiments of the present disclosure only refer to the structures related to the embodiments of the present disclosure, and other structures can refer to the general design.

(2) For the sake of clarity, in the drawings for describing embodiments of the present disclosure, the thickness of layers or regions is enlarged or reduced, that is, these drawings are not drawn to actual scale. It can be understood that when an element such as a layer, film, region or substrate is said to be located "on" or "below" another element, the element may be "directly" located "on" or "below" another element or there may be intermediate elements.

(3) Under the condition of no conflict, embodiments of the present disclosure and features in embodiments can be combined with each other to obtain new embodiments.

The above is only the specific embodiment of the present disclosure, but the protection scope of the present disclosure is not limited thereto. Any person familiar with this technical field can easily think of changes or substitutions within the technical scope disclosed in the present disclosure, which should be covered within the protection scope of the present disclosure. Therefore, the protection scope of the present disclosure shall be subject to the protection scope of the claims.

This application claims the priority of Chinese Patent Application No. 201911380721.9 filed on Dec. 27, 2019, the entire content of which is hereby incorporated by reference as a part of the present disclosure.

23

24

The invention claimed is:

1. A manufacturing method of a solar cell, comprising:
providing a silicon wafer in which a PN junction is formed;
forming an n-type doped silicon film on a first main surface of the silicon wafer at a first temperature, and simultaneously forming the n-type doped silicon film on at least a portion of surfaces of the silicon wafer except the first main surface due to wrapping around;
performing a heat treatment on the n-type doped silicon film at a second temperature;
etching and removing the n-type doped silicon film on the surfaces of the silicon wafer except the first main surface after performing the heat treatment; and
preparing a solar cell by using the silicon wafer with the n-type doped silicon film formed on the first main surface of the silicon wafer,
wherein the first temperature is lower than the second temperature,
wherein performing the heat treatment of the n-type doped silicon film at the second temperature comprises:
performing the heat treatment on the n-type doped silicon film within a temperature range of 590-750° C. for 10-60 minutes, to reduce a content of inactive doping atoms in the n-type doped silicon film,
wherein the preparing a solar cell by using the silicon wafer with the n-type doped silicon film formed on the first main surface of the silicon wafer comprises:
manufacturing an electrode of the solar cell on the n-type doped silicon film, to obtain the solar cell.

2. The manufacturing method of the solar cell according to claim 1, wherein after etching and removing the n-type doped silicon film on the surfaces except the first main surface, the manufacturing method further comprises:
annealing the n-type doped silicon film formed on the first main surface at a third temperature, the third temperature is higher than the first temperature.

3. The manufacturing method of the solar cell according to claim 1, wherein before forming the n-type doped silicon film on the first main surface of the silicon wafer at the first temperature, the manufacturing method further comprises:
forming a barrier layer on the surfaces of the silicon wafer except the first main surface.

4. The manufacturing method of the solar cell according to claim 3, wherein the barrier layer comprises a silicon oxide layer, a boron-doped silicon oxide layer, a silicon nitride layer or a combination of materials selected from a group consisting of a silicon oxide layer, a boron-doped silicon oxide layer and the silicon nitride layer, and a thickness range of the barrier layer is 30-500 nm.

5. The manufacturing method of the solar cell according to claim 1, wherein forming the n-type doped silicon film on the first main surface of the silicon wafer at the first temperature, and simultaneously forming the n-type doped silicon film on at least a portion of surfaces of the silicon wafer except the first main surface due to wrapping around comprises:
in-situ depositing the n-type doped silicon film on the first main surface of the silicon wafer at the first temperature, and simultaneously in-situ depositing the n-type doped silicon film on at least a portion of surfaces of the silicon wafer except the first main surface due to wrapping around, the n-type doped silicon film is an in-situ n-type doped silicon film.

6. The manufacturing method of the solar cell according to claim 5, wherein in-situ depositing the n-type doped silicon film on the first main surface of the silicon wafer at the first temperature, and simultaneously in-situ depositing the n-type doped silicon film on at least a portion of surfaces of the silicon wafer except the first main surface due to wrapping around, the n-type doped silicon film is an in-situ n-type doped silicon film comprises:
in-situ depositing the in-situ n-type doped silicon film with a thickness of 2 nm-2000 nm at a temperature lower than 580° C., by using a silicon-containing gas and a gas containing an n-type doping element as reaction precursors.

7. The manufacturing method of the solar cell according to claim 1, wherein, during forming the n-type doped silicon film on the first main surface of the silicon wafer at the first temperature, and simultaneously forming the n-type doped silicon film on at least a portion of surfaces of the silicon wafer except the first main surface due to wrapping around, the n-type doped silicon film is a single-layer n-type doped silicon film or a stacked layer formed by an n-type doped silicon film sub-layer and an un-doped silicon film sub-layer which are alternately arranged, and the silicon film includes an amorphous silicon film, a polysilicon film, or a mixed film of the amorphous silicon film and the polysilicon film.

8. The manufacturing method of the solar cell according to claim 1, wherein when or after performing the heat treatment on the n-type doped silicon film at the second temperature, and before etching and removing the n-type doped silicon film on the surfaces of the silicon wafer except the first main surface, the manufacturing method further comprises:
forming a silicon oxide layer on the n-type doped silicon film;
wherein before etching and removing the n-type doped silicon film on the surfaces of the silicon wafer except the first main surface and after forming the silicon oxide layer on the n-type doped silicon film, the manufacturing method further comprises:
removing the silicon oxide layer on the surfaces of the silicon wafer except the first main surface, and retaining the silicon oxide layer on the first main surface.

9. The manufacturing method of the solar cell according to claim 8, wherein removing the silicon oxide layer on the surfaces of the silicon wafer except the first main surface comprises:
removing the silicon oxide layer on the surfaces of the silicon wafer except the first main surface by using a hydrofluoric acid solution and at a same time retaining the silicon oxide layer on the first main surface of the silicon wafer.

10. The manufacturing method of the solar cell according to claim 1, wherein the silicon wafer is an n-type semiconductor silicon wafer, the first main surface is a back surface of the n-type semiconductor silicon wafer, and the surfaces of the silicon wafer except the first main surface include a front surface of the silicon wafer and a side surface of the silicon wafer.

11. A processing method of an n-type doped silicon film, comprising:
forming the n-type doped silicon film on a substrate at a first temperature;
performing a heat treatment on the n-type doped silicon film at a second temperature; and
etching and removing a portion of the n-type doped silicon film after the heat treatment,
wherein the first temperature is lower than the second temperature,
wherein performing the heat treatment of the n-type doped silicon film at the second temperature comprises:

performing the heat treatment on the n-type doped silicon film within a temperature range of 590-750° C. for 10-60 minutes, to reduce a content of inactive doping atoms in the n-type doped silicon film, wherein before etching and removing a portion of the n-type doped silicon film and at a same time of or after performing the heat treatment on the n-type doped silicon film, the processing method further comprises:

forming a silicon oxide layer on the n-type doped silicon film; and removing the silicon oxide layer on the portion of the n-type doped silicon film;

after etching and removing the portion of the n-type doped silicon film, the processing method further comprises:

removing the silicon oxide layer on the retained n-type doped silicon film;

performing an annealing process on the n-type doped silicon film at a third temperature, wherein the third temperature is higher than the first temperature.

12. The processing method of the n-type doped silicon film according to claim 11, wherein the forming the n-type doped silicon film on the substrate at the first temperature comprises:

in-situ depositing the n-type doped silicon film on the substrate at the first temperature, wherein the n-type doped silicon film is an in-situ n-type doped silicon film, the in-situ depositing the n-type doped silicon film on the substrate at the first temperature comprises:

in-situ depositing the n-type doped silicon film with a thickness of 2-2000 nm at a temperature lower than 580° C. on the substrate, by using a silicon-containing gas and a gas containing an n-type doping element as reaction precursors.

13. The processing method of the n-type doped silicon film according to claim 12, wherein the silicon-containing gas is silane and the gas containing the n-type doping element is phosphine, and the in-situ depositing the n-type doped silicon film with a thickness of 2-2000 nm at a temperature lower than 580° C. on the substrate comprises:

depositing the n-type doped silicon film in an LPCVD chamber under conditions that a chamber pressure is 0.1-0.6 Torr, a flow ratio of silane gas and phosphine gas is 1: (0.02-0.6), and a temperature is 480-570° C.; or depositing the n-type doped silicon film in a PECVD chamber under conditions that a chamber pressure is 0.1-10 Torr, a flow ratio of silane gas and phosphine gas is 1:(0.01-0.8), and a temperature is 170-420° C.; or depositing the n-type doped silicon film in an APCVD chamber under conditions that a chamber pressure is 760 Torr, a flow ratio of silane gas and phosphine gas is 1:(0.01-0.9), and a temperature is lower than 580° C.

14. The processing method of the n-type doped silicon film according to claim 11, wherein the forming the n-type doped silicon film on the substrate at the first temperature and the performing the heat treatment on the n-type doped silicon film at the second temperature are performed in a same chamber.

* * * * *